(12) United States Patent
Takaya et al.

(10) Patent No.: US 8,507,068 B2
(45) Date of Patent: Aug. 13, 2013

(54) ELEMENT SEALED BODY AND METHOD OF PRODUCING THE SAME

(75) Inventors: Tatsuya Takaya, Otsu (JP); Hiroshi Takimoto, Otsu (JP)

(73) Assignee: Nippon Electric Glass Co., Ltd., Shiga (JP)

( * ) Notice: Subject to any disclaimer, the term of this patent is extended or adjusted under 35 U.S.C. 154(b) by 356 days.

(21) Appl. No.: 12/826,982

(22) Filed: Jun. 30, 2010

(65) Prior Publication Data

US 2011/0045229 A1 Feb. 24, 2011

(30) Foreign Application Priority Data

Jul. 3, 2009 (JP) .................................. 2009-158851

(51) Int. Cl.
*C03B 17/00* (2006.01)
*B32B 15/00* (2006.01)

(52) U.S. Cl.
USPC .................................. 428/76; 428/68; 428/77

(58) Field of Classification Search
USPC ............................................... 428/76, 68, 77
See application file for complete search history.

(56) References Cited

U.S. PATENT DOCUMENTS

| 2003/0016447 A1 | 1/2003 | Kato et al. |
| 2004/0141141 A1 | 7/2004 | Ota et al. |
| 2008/0124558 A1 | 5/2008 | Boek et al. |

FOREIGN PATENT DOCUMENTS

| JP | 09-221342 | 8/1997 |
| JP | 2000-56113 | 2/2000 |
| JP | 2001-092376 | 4/2001 |
| JP | 2001-207152 | 7/2001 |
| JP | 2003-157968 | 5/2003 |
| JP | 2004-226880 | 8/2004 |
| JP | 2005-243366 | 9/2005 |
| JP | 2008-044839 | 2/2008 |

OTHER PUBLICATIONS

International Search Report and Written Opinion of the International Searching Authority issued Aug. 17, 2010 in International (PCT) Application No. PCT/JP2010/060996 (with partial English translation).
International Preliminary Report on Patentability and Written Opinion of the International Searching Authority issued Feb. 23, 2012 in International (PCT) Application No. PCT/JP2010/060996.

*Primary Examiner* — Brent O'Hern
(74) *Attorney, Agent, or Firm* — Wenderoth, Lind & Ponack, L.L.P.

(57) ABSTRACT

An element sealed body comprises a glass substrate, an element mounted on the glass substrate, and a protective glass for sealing the element, wherein a surface of the protective glass and a surface of the glass substrate, which are brought into contact with each other, have a surface roughness Ra of 2.0 nm or less respectively.

15 Claims, 5 Drawing Sheets

ELEMENT SEALED BODY AND METHOD OF PRODUCING THE SAME

TECHNICAL FIELD

The present invention relates to an element sealed body in which an element to be used for a flat panel display, such as a liquid crystal display or an OLED display, is sealed with glass.

BACKGROUND ART

In recent years, from the viewpoint of space saving, in place of a CRT type display conventionally and widely used, there have been widely used flat panel displays such as a liquid crystal display, a plasma display, an OLED display, and a field emission display. The OLED display is hard to up-sizing, and hence the OLED display is widely used for a display for a small device such as a mobile phone. The OLED display is fast in response rate and excellent in viewing angle compared with the liquid crystal display, and is small in power consumption compared with the plasma display. Thus, nowadays, the OLED display is expected to be put into mass production for large-screen television, and developments for larger OLED displays are advanced by various manufacturers.

A light-emitting element used for an OLED display deteriorates in quality through the contact of gasses such as oxygen and water vapor. Thus, a substrate used for the OLED display is required to have high gas-barrier property, and hence the use of a glass substrate is considered. However, when such a resin-based sealant as described in Patent Document 1 below is used for making the glass substrates adhere to each other, the gas-barrier property of the sealant may become insufficient. In that case, gasses such as oxygen and water vapor enter inside through the resin-made sealant during long-term use, leading to a problem that the light-emitting element has an aging degradation.

In order to solve the above-mentioned problem, Patent Document 2 below proposes that, in a case where glass substrates are sealed with each other, a light-emitting element is sealed by a glass frit with low melting point through a heat treatment. Patent Document 2 below describes that a flit composition including a glass portion which contains a base component containing $SiO_2$, $B_2O_3$, and $Al_2O_3$ and at least one absorbing component (at least one of CuO, $Fe_2O_3$, $V_2O_5$, and $TiO_2$) is subjected to sintering at about 700° C., thereby to seal the element.

However, the light-emitting element used for an OLED display is labile to high heat. Thus, when the frit composition described in Patent Document 2 below is used, the light-emitting element on the substrate may be destroyed through the sintering process at as high temperature as 700° C.

PRIOR ART DOCUMENTS

Patent Document

Patent Document 1: JP 2001-207152 A
Patent Document 2: JP 2008-044839 A

SUMMARY OF INVENTION

Technical Problem

The present invention has been made to solve the above-mentioned problems in prior arts. An object of the present invention is therefore to provide an element sealed body that is excellent in gas-barrier property and can be produced by sealing at room temperature, and to a method of producing the element sealed body.

Solution to Problem

A first aspect of the invention relates to an element sealed body comprising a glass substrate, an element mounted on the glass substrate, and a protective glass for sealing the element, wherein a surface of the protective glass and a surface of the glass substrate, which are brought into contact with each other, have a surface roughness Ra of 2.0 nm or less respectively.

A second aspect of the invention relates to an element sealed body according to the first aspect, wherein a difference of thermal expansion coefficients between the protective glass and the glass substrate at 30 to 380° C. falls within $5\times10^{-7}/°C$.

A third aspect of the invention relates to an element sealed body according to the first or second aspect, wherein the glass substrate and the protective glass are formed by an overflow down-draw method.

A fourth aspect of the invention relates to an element sealed body according to any one of the first to third aspects, wherein at least one of the glass substrate and the protective glass has a thickness of 300 μm or less.

A fifth aspect of the invention relates to an element sealed body according to any one of the first to fourth aspects, wherein the element has a thickness of 500 μm or less.

A sixth aspect of the invention relates to an element sealed body according to any one of the first to fifth aspects, wherein at least one of the glass substrate and the protective glass has a recessed portion provided therein.

A seventh aspect of the invention relates to an element sealed body according to any one of the first to sixth aspects, wherein the protective glass comprises a spacer glass surrounding the element and having a thickness greater than or equal to that of the element, and a cover glass covering the element, one surface of the spacer glass is brought into contact with the glass substrate and the other surface of the spacer glass is brought into contact with the cover glass, and the one surface of the spacer glass, the other surface of the spacer glass, and a surface of the cover glass being brought into contact with the spacer glass, have a surface roughness Ra of 2.0 nm or less respectively.

An eighth aspect of the invention relates to an element sealed body according to any one of the first to sixth aspects, wherein the surface of the protective glass and the surface of the glass substrate, which are brought into contact with each other, have a GI value of 1000 pcs/m² or less respectively.

A ninth aspect of the invention relates to an element sealed body according to the seventh aspect, wherein the one surface of the spacer glass, the other surface of the spacer glass, and the surface of the cover glass being brought into contact with the spacer glass, have a GI value of 1000 pcs/m² or less respectively.

A tenth aspect of the invention relates to a method of producing an element sealed body, comprising the steps of mounting an element on a glass substrate and sealing the element with a protective glass, wherein a surface of the glass substrate and a surface of the protective glass, which are brought into contact with each other, have a surface roughness Ra of 2.0 nm or less respectively.

An eleventh aspect of the invention relates to a method of producing an element sealed body according to the tenth aspect, wherein the surface of the protective glass and the surface of the glass substrate, which are brought into contact with each other, have a GI value of 1000 pcs/m² or less respectively.

Effects of Invention

According to the first aspect of the invention, the element sealed body comprises the glass substrate, the element mounted on the glass substrate, and the protective glass for sealing the element, wherein the surface of the protective glass and the surface of the glass substrate, which are brought into contact with each other, have a surface roughness Ra of 2.0 nm or less respectively. Thus, the surface of the protective glass and the surface of the glass substrate are so smooth to have a close contact with each other, and hence the element can be sealed firmly and stably with the protective glass and the glass substrate. Since the element is sealed by the mutual adhesion of the both glasses without use of a resin-made sealant, the element sealed body is excellent in gas-barrier property, which can prevent the deterioration of the element caused by gasses such as oxygen and water vapor entering inside through the resin layer. In addition, a sintering process of a glass frit is not required, and hence sealing the element can be carried out at room temperature without heating the element. Thus, it is possible to prevent the element from deteriorating through a heating process.

On the other hand, if the surface roughness Ra exceeds 2.0 nm, the degree of contact is decreased. As a result, it is not possible to firmly seal the element with the protective glass and the glass substrate without use of an adhesive or the sintering process of a glass frit.

According to the second aspect of the invention, since the difference of thermal expansion coefficients between the protective glass and the glass substrate at 30 to 380° C. falls within $5 \times 10^{-7}/°$ C., the element sealed body can be less suffering from thermal warpage or the like.

According to the third aspect of the invention, since the protective glass and the glass substrate are formed by the overflow down-draw method, these glasses can have an extremely smooth surface without carrying out a polishing process. With this, the element can be sealed more firmly with the protective glass and the glass substrate.

According to the fourth aspect of the invention, since at least one of the glass substrate and the protective glass has a thickness of 300 μm or less, the element can be sealed so as to be covered with the glasses that have a flexibility.

According to the fifth aspect of the invention, since the element has a thickness of 500 μm or less, the element can be properly sealed by applying the protective glass to the glass substrate, without providing a recessed portion for fitting the element in the glass substrate.

According to the sixth aspect of the invention, since at least one of the glass substrate and the protective glass has the recessed portion provided therein, the element can be sealed with the glass substrate and the protective glass, while the thickness of the element is bypassed.

According to the seventh aspect of the invention, since the protective glass comprises the spacer glass surrounding the element and having a thickness greater than or equal to that of the element, and the cover glass covering the element, the element sealed body can be produced without any restriction depending on the thickness of the element. One surface of the spacer glass is brought into contact with the glass substrate and the other surface of the spacer glass is brought into contact with the cover glass, and the one surface of the spacer glass, the other surface of the spacer glass, and the surface of the cover glass being brought into contact with the spacer glass, have a surface roughness Ra of 2.0 nm or less respectively. Thus, the contacting surfaces of these glasses are so smooth to have a close contact, so that the element can be sealed firmly and stably.

According to the eighth or ninth aspect of the invention, since the surfaces of the glasses being brought into contact with each other have a GI value of 1000 pcs/m² or less respectively, the contacting surfaces of the glasses are clean, leading to undamaged surface activity. As a result, it is possible to seal the element more firmly and more stably without use of an adhesive.

According to the tenth aspect of the invention, the method of producing an element sealed body comprises the steps of mounting the element on the glass substrate and sealing the element with the protective glass, wherein the surface of the glass substrate and the surface of the protective glass, which are brought into contact with each other, have a surface roughness Ra of 2.0 nm or less respectively. Thus, the above-mentioned element sealed body can be produced at room temperature.

According to the eleventh aspect of the invention, since the surface of the protective glass and the surface of the glass substrate, which are brought into contact with each other, have a GI value of 1000 pcs/m² or less respectively, it is possible to produce an element sealed body at room temperature, wherein the element is sealed more firmly and more stably.

DETAILED DESCRIPTION OF THE INVENTION

Hereinafter, preferred embodiments of an element sealed body according to the present invention are described with reference to the drawings.

Figure 1A:
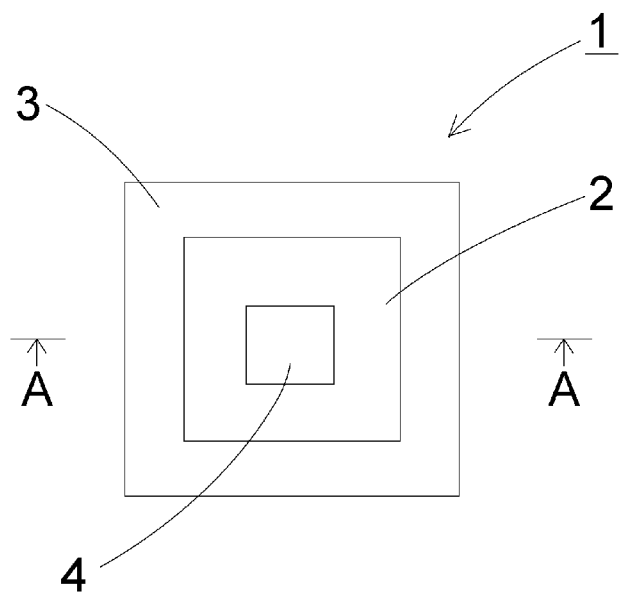
FIG. 1(a) is a plan view of an element sealed body according to the present invention.
Figure 1B:
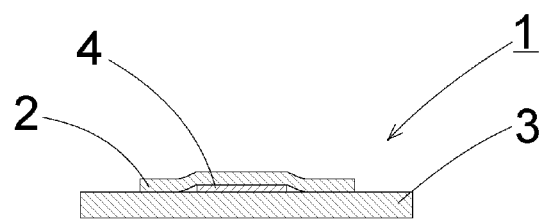
FIG. 1(b) is a cross-sectional view taken along the line A-A of FIG. 1(a).

As shown in FIGS. 1(a) and 1(b), an element sealed body (1) according to the present invention is provided with a protective glass (2) covering an element (4) mounted on a glass substrate (3), and the protective glass (2) and the glass substrate (3) are mutually bonded without use of a resin-made adhesive, a glass frit, or the like, to thereby seal the element (4).

For the protective glass (2), silicate glass is used, silica glass or borosilicate glass is preferably used, or alkali-free glass is most preferably used. The use of the alkali-free glass can eliminate the need for applying silica coating onto the protective glass (2) to reduce the number of processes and cost. If the protective glass (2) contains alkali components, the alkali components may elute off to damage the element. Note that the alkali-free glass is glass substantially free of an alkali component (alkali metal oxide), specifically glass that contains the alkali component of 1000 ppm or less. For the present invention, the content of the alkali component is preferably 500 ppm or less, or more preferably 300 ppm or less.

The protective glass (2) has a thickness of preferably 300 μm or less, more preferably 1 μm to 200 μm, or most preferably 1 μm to 100 μm. This is because such a thinner thickness of the protective glass (2) can allow the protective glass (2) to be imparted with an appropriate flexibility so that proper sealing can be carried out by covering the element (4) mounted on the glass substrate (3) directly with the protective glass (2). If the protective glass (2) has a thickness of less than 1 μm, the protective glass (2) tends to have insufficient strength. As a result, the protective glass (2) may be broken by an impact.

For the glass substrate (3), similarly to the protective glass (2), silicate glass, silica glass, borosilicate glass, alkali-free glass, or the like is used. The glass substrate (3) is preferably made of glass that has a difference of thermal expansion coefficients at 30 to 380° C. with respect to the protective glass (2) falling within $5 \times 10^{-7}/°$ C. This allows the element sealed body (1) to less suffer from thermal warpage or the like due to the difference in thermal expansion coefficients, so that the element sealed body (1) can maintain a stable sealed state.

Surface roughness Ra of each of the surfaces of the protective glass (2) and the glass substrate (3) on the sides being brought into contact with each other is 2.0 nm or less. If the surface roughness Ra exceeds 2.0 nm, the degree of contact therebetween is decreased. As a result, it is not possible to firmly seal the element (4) with the protective glass (2) and the glass substrate (3) without use of adhesive or sintering of a glass frit. The surfaces of the protective glass (2) and glass substrate (3) have a surface roughness Ra of preferably 1.0 nm or less, more preferably 0.5 nm or less, or most preferably 0.2 nm or less, respectively.

The surface of the protective glass (2) and the surface of the glass substrate (3), which are brought into contact with each other, preferably have a Glass Inspection (GI) value of 1000 pcs/m² or less respectively. With this, the contacting surfaces of the protective glass (2) and glass substrate (3) are clean without loss of the activities of the surfaces. As a result, it is possible to seal the element (4) with the protective glass (2) and the glass substrate (3) more firmly and more stably without use of adhesive or sintering of a glass frit. The GI value used in the present specification refers to a number (pcs) of impurity particles having a major diameter of 1 μm or more and existing in a region of 1 m². The surfaces of the protective glass (2) and glass substrate (3) have a GI value of more preferably 500 pcs/m² or less, or most preferably 100 pcs/m² or less, respectively.

Figure 2:
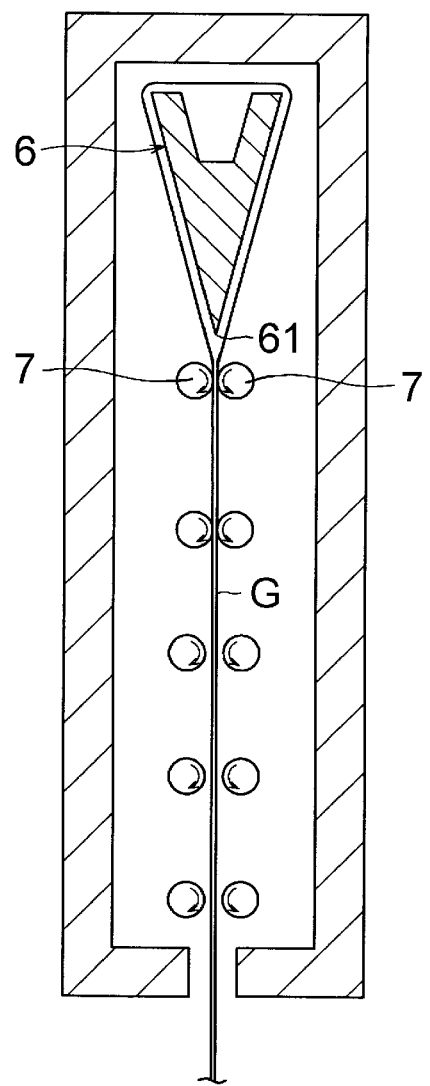
FIG. 2 is an explanatory diagram of a manufacturing apparatus for a protective glass and a glass substrate.

The protective glass (2) and the glass substrate (3) to be used in the present invention are preferably formed by a down-draw method. This is because the protective glass (2) and the glass substrate (3) can be formed so as to have a smoother surface. In particular, the overflow down-draw method shown in FIG. 2 is a forming method in which both surfaces of a glass sheet are not brought into contact with a forming body during a forming process, and hence flaws are hardly caused on the both surfaces (transparent surfaces) of the obtained glass sheet, and high surface-quality may be obtained for the glass sheet without polishing. With this, it is possible to seal the element (4) with the protective glass (2) and the glass substrate (3) more firmly.

A glass ribbon (G) immediately after being flown down from a lower end portion (61) of a forming body (6) having a wedge shape in cross-section is drawn downwardly while being restricted shrinkage in a width direction by cooling rollers (7), to be thin in a predetermined thickness. Subsequently, the glass ribbon (G) having the predetermined thickness is annealed in an annealer to remove heat strain in the glass ribbon (G), followed by cutting of the glass ribbon (G) into a predetermined size. As a result, a glass sheet serving as the protective glass (2) or the glass substrate (3) is formed.

In the case where an edge side of one of the protective glass (2) and the glass substrate (3), which has a smaller thickness, does not protrude from an edge side of the other, the peeling off between the glass substrate (3) and the protective glass (2) can be prevented. If the edge side of the one having the smaller thickness protrudes from the edge side of the other, the protective glass (2) and the glass substrate (3) may peel off from each other due to interference in the protruded portion by something else during handling the element sealed body. When the protective glass (2) and the glass substrate (3) are identical in size, the peeling off between the glass substrate (3) and the protective glass (2) can be also prevented, since the interference portion is nor generated.

In the case where an edge side of one of the protective glass (2) and the glass substrate (3), which has a smaller thickness, protrudes from an edge side of the other, the peeling off between the glass substrate (3) and the protective glass (2) can be carried out after the element (4) is sealed. When an electronic device using the element sealed body (1) according to the present invention is disposed of, the element and glass can be easily separated. As a result, recycling of the glass can be easily carried out.

The element (4) to be sealed is not particularly limited. For example, various MEMS devices including a heat conversion element can be used. In the element sealed body (1) according to the present invention, the protective glass (2) excellent in translucency is used to carry out sealing, and hence it is possible to properly seal a light-receiving element, a light-emitting element, a photoelectric conversion element, a touch panel, or the like. Since the element sealed body (1) according to the present invention is excellent in gas-barrier property and can be produced by sealing at low temperature, in particular, a light-emitting element such as an OLED element can be properly sealed.

Figure 3A:
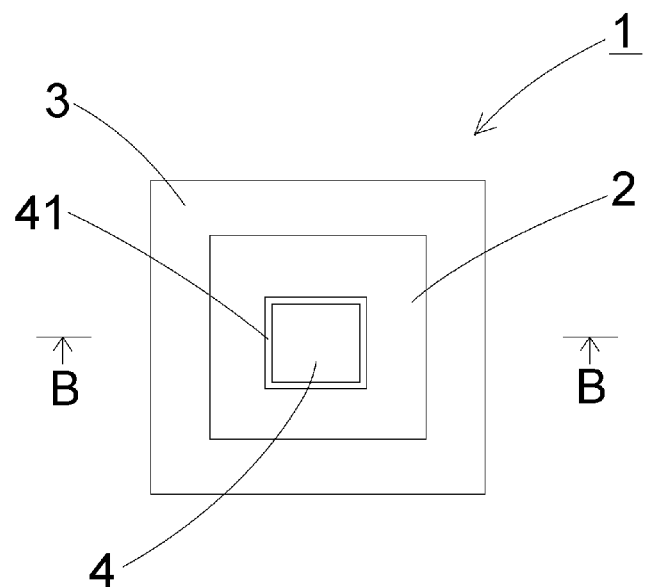
FIG. 3(a) is a plan view showing a state in which a recessed portion is provided in a glass substrate.
Figure 3B:
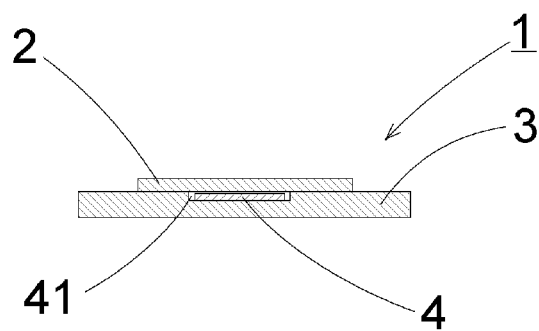
FIG. 3(b) is a cross-sectional view taken along the line B-B of FIG. 3(a).

The element (4) preferably has a thickness of 500 μm or less. This is because, with such a thickness, the element (4) can be sealed by covering the element (4) with the protective glass (2) without providing a recessed portion for fitting the element (4) in the glass substrate (3). When the element (4) has a thickness of more than 500 μm, as shown in FIGS. 3(a) and 3(b), a recessed portion (41) capable of fitting the element (4) is formed in the glass substrate (3) by etching or the like, and the element (4) is set in the recessed portion (41), followed by sealing by covering the element (4) with the protective glass (2). In addition, it is preferred that the glass substrate (3) be etched to a depth equal to the thickness of the element (4) so that the upper surface of the element (4) and the surface of the glass substrate (3) are positioned at the same level. This is aimed at preventing the formation of a swelling or a recess when the element (4) is covered with the protective glass (2). FIGS. 3(a) and 3(b) show a state in which the recessed portion (41) is formed in the glass substrate (3), however, it is not limited to this configuration. The recessed portion (41) may be formed in the protective glass (2), or the recessed portions (41) may be formed in both the glass substrate (3) and the protective glass (2).

The ratio of the contact area between the glass substrate (3) and the protective glass (2) to the contact area between the glass substrate (3) and the element (4) is preferably 1:0.19 to 1:24.3, more preferably 1:0.56 to 1:11.8, or most preferably 1:1.78 to 1:6.76. If the contact area (adhesion area) between the glass substrate (3) and the protective glass (2) is too small, sufficient sealing may not be carried out. In addition, if the contact area (adhesion area) between the glass substrate (3) and the protective glass (2) is too large, the effective arrangement of the element (4) may not be attained.

Figure 4A:
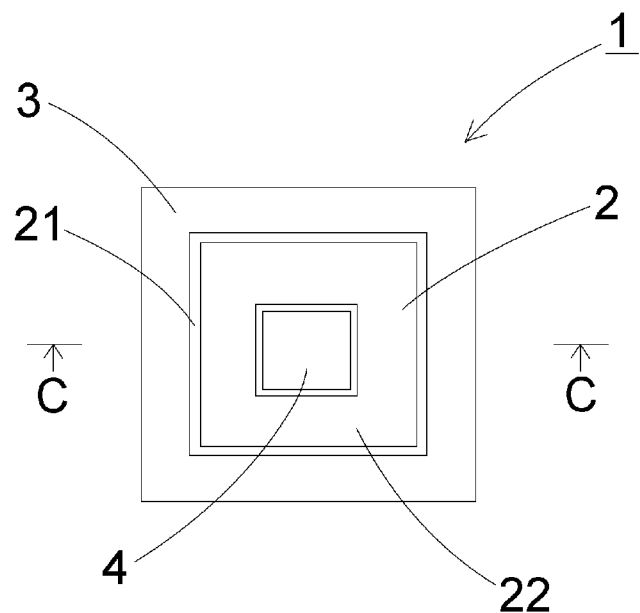
FIG. 4(a) is a plan view of an element sealed body in a state in which a protective glass includes a spacer glass and a cover glass.
Figure 4B:
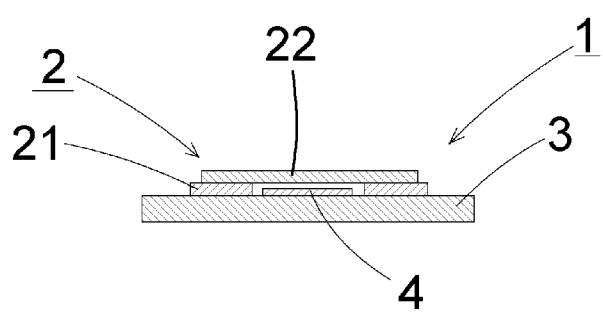
FIG. 4(b) is a cross-sectional view taken along the line C-C of FIG. 4(a).

FIGS. 4(a) and 4(b) are views of an element sealed body in which a protective glass comprises a spacer glass and a cover glass. FIG. 4(a) is a plan view, and FIG. 4(b) is a cross-sectional view taken along the line C-C of FIG. 4(a).

In the element sealed body (1) according to this embodiment, the protective glass (2) comprises a spacer glass (21) and a cover glass (22). Both the spacer glass (21) and the cover glass (22) are preferably formed by the overflow down-draw method, in order to have a high surface-quality. The spacer glass (21) preferably has a thickness greater than or equal to that of the element (4). In the spacer glass (21), a hole for fitting the element (4) is formed with a known laser or the like.

The element (4) is mounted on the glass substrate (3), and the spacer glass (21) is brought into contact with the glass substrate (3) so as to surround the element (4). After that, the spacer glass (21) and the cover glass (22) are brought into contact with each other so that the element (4) is covered from above, to thereby carry out sealing. One surface of the spacer glass (21) is brought into contact with the glass substrate (3) and the other surface of the spacer glass (21) is brought into contact with the cover glass (22), thereby to adhere to each other. For such the adhesions, the one surface and the other surface of the spacer glass (21), the surface of the cover glass (22), which is brought into contact with the spacer glass (21), and the surface of the glass substrate (3), which is brought into contact with the spacer glass (21), have a surface roughness Ra of 2.0 nm or less respectively, and preferably have a GI value of 1000 pcs/m² or less respectively.

Figure 5A:
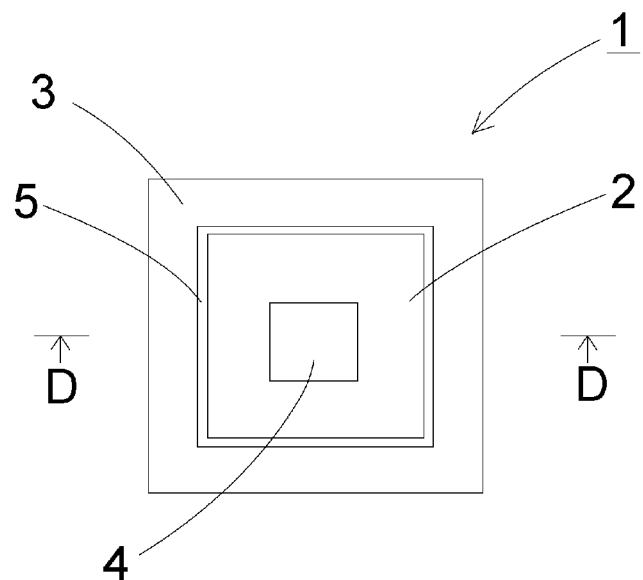
FIG. 5(a) is a plan view showing a state in which a fixing layer is provided along a peripheral portion of a protective glass.
Figure 5B:
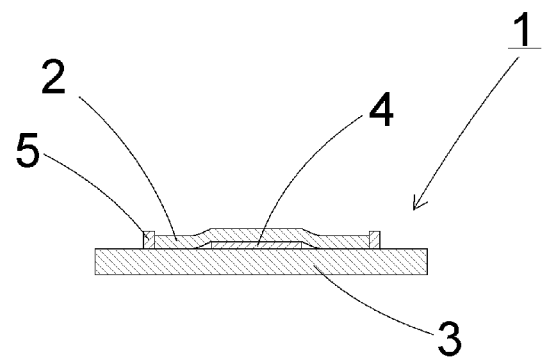
FIG. 5(b) is a cross-sectional view taken along the line D-D of FIG. 5(a).

FIGS. 5(a) and 5(b) are views showing an element sealed body in which a fixing layer is provided along a peripheral portion of a protective glass. FIG. 5(a) is a plan view, and FIG. 5(b) is a cross-sectional view taken along the line D-D of FIG. 5(a).

In the element sealed body (1) according to the present invention, as in the embodiment shown in FIGS. 3(a) and 3(b), the element (4) is mounted on the glass substrate (3), the protective glass (2) is provided so as to cover the element (4), and then, as shown in FIGS. 5(a) and 5(b), the edge portion of the protective glass (2) is preferably fixed with a fixing layer (5). With this, peeling off is prevented from starting at the edge portion of the protective glass (2).

The fixing layer (5) is provided, as shown in FIGS. 5(a) and 5(b), on the glass substrate (3) along the edge portion of the protective glass (2). Further, the fixing layer (5) is preferably higher than the thickness of the protective glass (2) for the purpose of preventing peeling off from starting at the edge portion of the protective glass (2). In addition, it is not limited to the configuration shown in FIGS. 5(a) and 5(b). The fixing layer (5) may be provided in such a way as extending over the glass substrate (3) and the protective glass (2) so as to cover the edge portion of the protective glass (2). The fixing layer (5) is not particularly required to have gas-barrier property, and is used only for the purpose of fixing the protective glass (2). Thus, any commonly-known resin or the like can be used as the fixing layer (5). Further, the fixing layer (5) may be provided preliminarily as a rib-like glass on the glass substrate (3) through a forming process or a working process.

Example 1

Hereinafter, the element sealed body of the present invention is described in detail based on examples, but the present invention is not limited to these examples.

A transparent glass sheet having a rectangular shape of 100 mm in length, 100 mm in width, and 700 μm in thickness was used as a glass substrate. A protective glass having 80 mm in length, 80 mm in width, and 100 μm in thickness was used as a protective glass to be laminated on the glass substrate. Used for the glass substrate and the protective glass was alkali-free glass manufactured by Nippon Electric Glass Co., Ltd. (Production name: OA-10G, thermal expansion coefficient at 30 to 380° C.: $38 \times 10^{-7}$/° C.). The glass formed by the overflow down-draw method was used without polishing as it is, or by appropriately controlling amounts of polishing and chemical etching, to thereby control the surface roughness Ra. The surface roughness Ra of the contacting surface of each of the glass substrate and the protective glass was measured by using an AFM (Nanoscope III a) manufactured by Veeco Instruments under the conditions of a scan size of 10 μm, a scan rate of 1 Hz, and 512 sample lines. The surface roughness Ra was determined from measured values within a 10 μm-square measurement range. After the measurement, each of the glass substrates and the protective glasses was divided into test groups shown in Table 1.

With respect to the glass substrates and the protective glasses thus grouped, by controlling cleaning and indoor air conditioning, amounts of dust contained in the water and the air were adjusted, and thus amounts of dust attaching to the contacting surfaces of the glass substrates and protective glasses were adjusted, to thereby control the GI value. The GI value was measured by using GI7000 manufactured by Hitachi High-Tech Electronics Engineering Co., Ltd.

After that, in accordance to the respective groups shown in Table 1, a drop of ink was each dropped on the centers of the glass substrates, the glass substrates were then covered with the protective glasses from above, and the glass substrates and the protective glasses were brought into close contact, to thereby obtain the element sealed bodies of Examples 1 to 8 and Comparative Examples 1 to 3.

The obtained element sealed bodies were evaluated for the degree of sealing based on the presence or absence of ink leak. As for the element sealed bodies, in which glasses were not adhered to each other, "x" are marked. As for the element sealed bodies, from which ink did not leak even though the element sealed bodies were inclined, "○" are marked. As for the element sealed bodies, from which no ink leaked even though the protective glasses were pushed, "⊚" are marked. The sealing property of the element sealed bodies was thus determined. Table 1 shows the results.

TABLE 1

|  | Example 1 | Example 2 | Example 3 | Example 4 |
| --- | --- | --- | --- | --- |
| Glass substrate Ra (nm) | 0.2 | 0.5 | 1.0 | 2.0 |
| Protective glass Ra (nm) | 0.2 | 0.5 | 1.0 | 2.0 |
| Glass substrate GI value (pcs/m²) | 100 | 100 | 100 | 100 |
| Protective glass GI value (pcs/m²) | 100 | 100 | 100 | 100 |
| Result of determination | ⊚ | ⊚ | ⊚ | ○ |

TABLE 1-continued

|  | Example 5 | Example 6 | Example 7 | Example 8 |
|---|---|---|---|---|
| Glass substrate Ra (nm) | 0.2 | 0.2 | 0.2 | 0.2 |
| Protective glass Ra (nm) | 0.5 | 0.5 | 0.5 | 0.5 |
| Glass substrate GI value (pcs/m$^2$) | 100 | 500 | 800 | 1000 |
| Protective glass GI value (pcs/m$^2$) | 100 | 500 | 800 | 1000 |
| Result of determination | ⊚ | ○ | ○ | ○ |

|  | Comparative Example 1 | Comparative Example 2 | Comparative Example 3 |
|---|---|---|---|
| Glass substrate Ra (nm) | 1.0 | 2.5 | 2.5 |
| Protective glass Ra (nm) | 2.5 | 1.0 | 2.5 |
| Glass substrate GI value (pcs/m$^2$) | 100 | 100 | 100 |
| Protective glass GI value (pcs/m$^2$) | 100 | 100 | 100 |
| Result of determination | X | X | X |

As shown in Table 1, it is found that in Examples 1 to 8, in which the protective glass and the glass substrate have a surface roughness Ra of 2.0 nm or less respectively, the protective glass and the glass substrate have a sufficient close contact, and hence the sealing therebetween is accomplished. Contrary to this, it is found that in Comparative Examples 1 to 3, in which one or both of the protective glass and the glass substrate have a surface roughness Ra of 2.5 nm or more, in spite of low GI value, the close contact therebetween is low due to the rough contact surfaces, resulting in incomplete sealing therebetween.

INDUSTRIAL APPLICABILITY

The present invention can be suitably used for sealing a light-emitting element such as an OLED element.

| Description of Symbols | |
|---|---|
| 1 | element sealed body |
| 2 | protective glass |
| 21 | spacer glass |
| 22 | cover glass |
| 3 | glass substrate |
| 4 | element |
| 41 | recessed portion |
| 5 | fixing layer |

The invention claimed is:

1. An element sealed body comprising a glass substrate, an element mounted on the glass substrate, and a protective glass for sealing the element, wherein
each of a surface of the protective glass and a surface of the glass substrate, which are brought into contact with each other, has a surface roughness Ra of 2.0 nm or less, the surface of the protective glass and the surface of the glass substrate directly adhering to each other without use of an adhesive or a sintering process to seal the element between the protective glass and the glass substrate.

2. An element sealed body according to claim 1, wherein a difference of thermal expansion coefficients between the protective glass and the glass substrate at 30 to 380° C. is 5×10$^{-7}$/° C. or less.

3. An element sealed body according to claim 1, wherein the glass substrate and the protective glass are formed by an overflow down-draw method.

4. An element sealed body according to claim 1, wherein at least one of the glass substrate and the protective glass has a thickness of 300 μm or less.

5. An element sealed body according to claim 1, wherein the element has a thickness of 500 μm or less.

6. An element sealed body according to claim 1, wherein at least one of the glass substrate and the protective glass has a recessed portion provided therein in which the element is fitted.

7. An element sealed body according to claim 1, wherein
the protective glass comprises a spacer glass surrounding the element and having a thickness greater than or equal to that of the element, and a cover glass covering the element,
one surface of the spacer glass, as the surface of the protective glass, is brought into contact with the surface of the glass substrate and another surface of the spacer glass is brought into contact with a surface of the cover glass, and
each of the one surface of the spacer glass, the other surface of the spacer glass, and the surface of the cover glass has a surface roughness Ra of 2.0 nm or less, the one surface of the spacer glass and the surface of the glass substrate directly adhering to each other without use of an adhesive or a sintering process, and the other surface of the spacer glass and the surface of the cover glass directly adhering to each other without use of an adhesive or a sintering process.

8. An element sealed body according to claim 1, wherein each of the surface of the protective glass and the surface of the glass substrate, which are brought into contact with each other, has a Glass Inspection (GI) value of 1000 pcs/m$^2$ or less.

9. An element sealed body according to claim 7, wherein each of the one surface of the spacer glass, the other surface of the spacer glass, and the surface of the cover glass has a Glass Inspection (GI) value of 1000 pcs/m$^2$ or less.

10. An element sealed body according to claim 2, wherein the glass substrate and the protective glass are formed by an overflow down-draw method.

11. An element sealed body according to claim 2, wherein at least one of the glass substrate and the protective glass has a thickness of 300 μm or less.

12. An element sealed body according to claim 2, wherein the element has a thickness of 500 μm or less.

13. An element sealed body according to claim 2, wherein at least one of the glass substrate and the protective glass has a recessed portion provided therein in which the element is fitted.

14. An element sealed body according to claim 2, wherein
the protective glass comprises a spacer glass surrounding the element and having a thickness greater than or equal to that of the element, and a cover glass covering the element,
one surface of the spacer glass, as the surface of the protective glass, is brought into contact with the surface of the glass substrate and another surface of the spacer glass is brought into contact with a surface of the cover glass, and
each of the one surface of the spacer glass, the other surface of the spacer glass, and the surface of the cover glass has a surface roughness Ra of 2.0 nm or less, the one surface of the spacer glass and the surface of the glass substrate directly adhering to each other without use of an adhesive or a sintering process, and the other surface of the spacer glass and the surface of the cover glass directly adhering to each other without use of an adhesive or a sintering process.

15. An element sealed body according to claim 2, wherein each of the surface of the protective glass and the surface of the glass substrate, which are brought into contact with each other, has a Glass Inspection (GI) value of 1000 pcs/m$^2$ or less.

* * * * *